United States Patent
Ignjatovic et al.

(10) Patent No.: US 7,466,255 B1
(45) Date of Patent: Dec. 16, 2008

(54) MULTIPLEXED-INPUT-SEPARATED Σ-Δ ANALOG-TO-DIGITAL CONVERTER FOR PIXEL-LEVEL ANALOG-TO-DIGITAL CONVERSION UTILIZING A FEEDBACK DAC SEPARATION

(75) Inventors: Zeljko Ignjatovic, Rochester, NY (US); Mark F. Bocko, Caledonia, NY (US)

(73) Assignee: University of Rochester, Rochester, NY (US)

( * ) Notice: Subject to any disclaimer, the term of this patent is extended or adjusted under 35 U.S.C. 154(b) by 4 days.

(21) Appl. No.: 11/600,914

(22) Filed: Nov. 17, 2006

Related U.S. Application Data

(60) Provisional application No. 60/737,418, filed on Nov. 17, 2005.

(51) Int. Cl.
*H03M 3/00* (2006.01)
(52) U.S. Cl. .................. 341/143; 348/308; 341/155
(58) Field of Classification Search .................. 341/143, 341/155; 348/308
See application file for complete search history.

(56) References Cited

U.S. PATENT DOCUMENTS

| 5,248,971 | A | 9/1993 | Mandl |
| 5,515,046 | A | 5/1996 | Mandl |
| 5,659,315 | A | 8/1997 | Mandl |
| 6,597,371 | B2 | 7/2003 | Mandl |
| 6,741,198 | B2 * | 5/2004 | McIlrath ...................... 341/155 |
| 7,023,369 | B2 * | 4/2006 | Bocko et al. ................ 341/143 |

OTHER PUBLICATIONS

Z. Ignjatovic, et al., "A 0.88nW/pixel, 99.6 dB Linear-Dynamic-Range Fully-Digital Image Sensor Employing a Pixel-Level Sigma-Delta ADC", IEEE VLSI Symposium, Jun. 14 and 15, 2006.

* cited by examiner

*Primary Examiner*—Howard Williams
(74) *Attorney, Agent, or Firm*—Blank Rome LLP

(57) ABSTRACT

In an array of imaging elements, a pixel level analog-to-digital-converter design splits the quantizer into an input transistor at the pixel location and a quantizer body for each row. The feedback digital-to-analog converter is also split into two components, one at the pixel location and one provided either for each row or for the entire array.

19 Claims, 7 Drawing Sheets

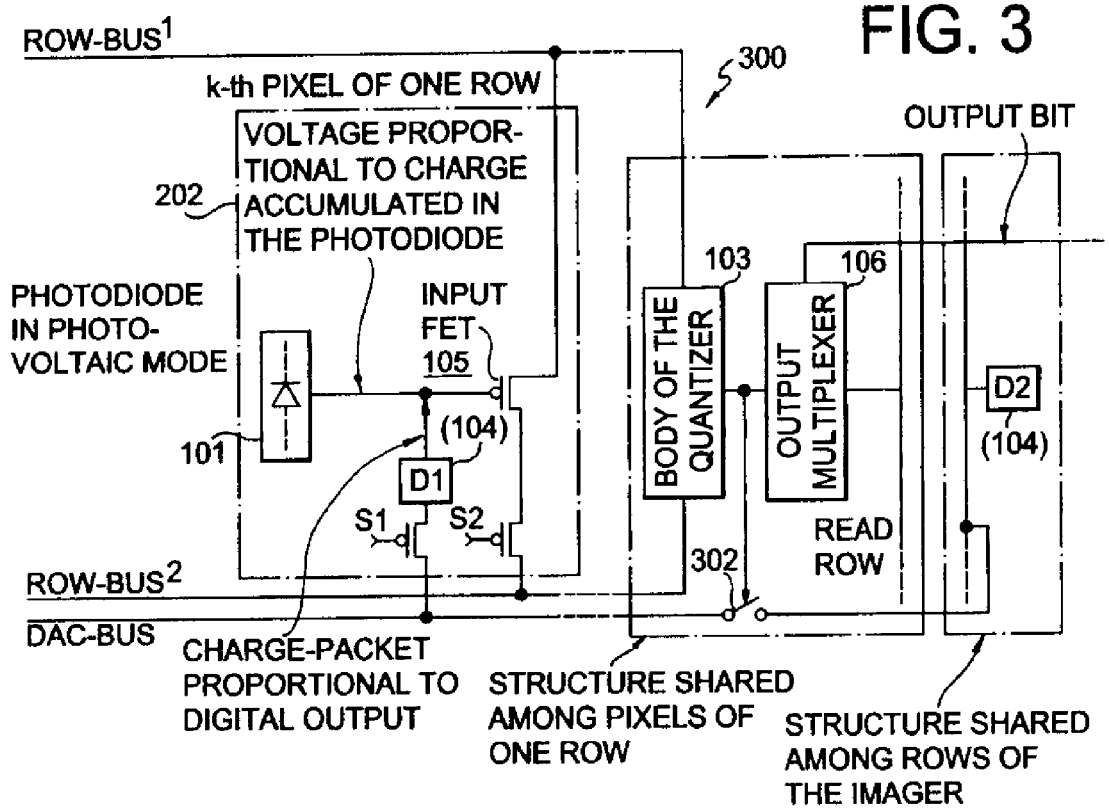
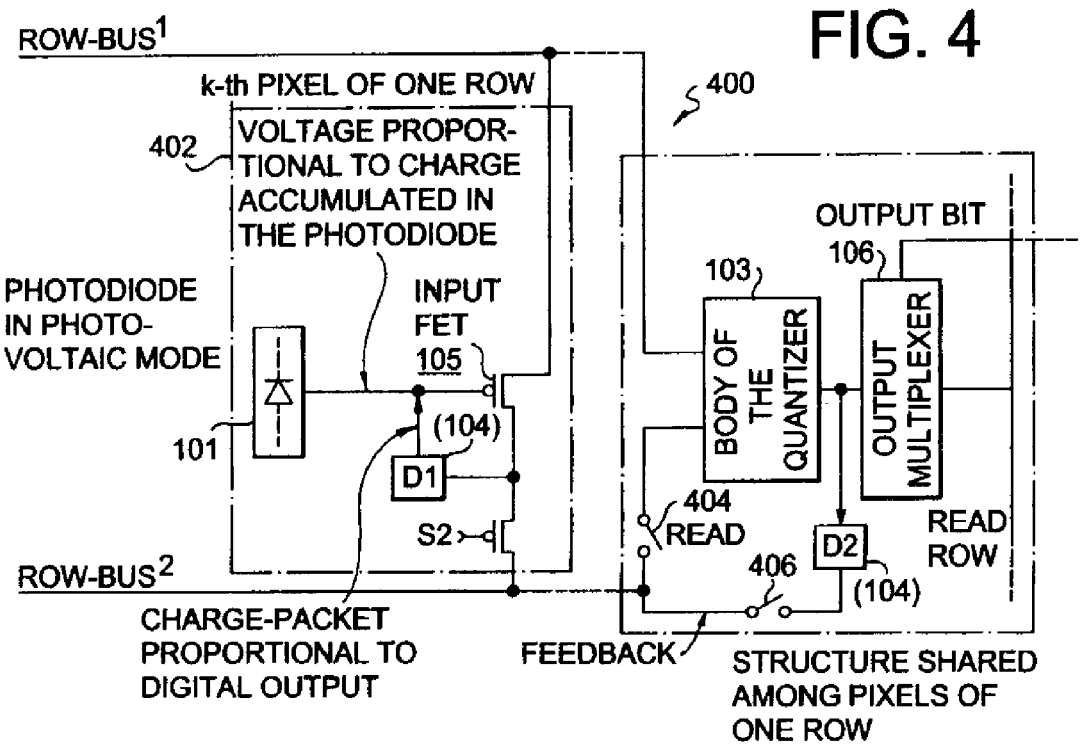

MULTIPLEXED-INPUT-SEPARATED Σ-Δ ANALOG-TO-DIGITAL CONVERTER FOR PIXEL-LEVEL ANALOG-TO-DIGITAL CONVERSION UTILIZING A FEEDBACK DAC SEPARATION

REFERENCE TO RELATED APPLICATION

The present application claims the benefit of U.S. Provisional Patent Application No. 60/737,418, filed Nov. 17, 2005, whose disclosure is hereby incorporated by reference in its entirety into the present disclosure.

FIELD OF THE INVENTION

The present invention is directed to a sigma-delta (ΣΔ) analog-to-digital converter (ADC) design and more particularly to a multiplexed-input-separated (MIS) ΣΔ ADC design adapted for use as a pixel-level ADC in a pixel readout circuit employed in a CMOS image sensors.

DESCRIPTION OF RELATED ART

Charge-coupled-device (CCD) imagers were first developed in the 1970's in the defense sector but quickly found acceptance among professional astronomers when they began using CCD cameras instead of photographic films and plates. There were several advantages that favored CCD cameras over photographic film:

CCD cameras are up to 100 times more sensitive than film;
CCD images are readily digitized, eliminating film-processing;
CCD cameras have a much greater dynamic range than film, so they can more easily capture both faint and bright details in a single exposure; and
CCD imagers have greater spatial resolution than film, so they can resolve finer details.

Throughout the last two decades CCDs have been the most widely used imaging technology. They have continued to improve and their principal advantages such as sensitivity (or quantum efficiency) of about 80%, very high dynamic range (five orders of magnitude) and linearity are still the highest among all commercially available imagers. However, the biggest disadvantage of CCD imagers is their small format and/or high price. CCD sensors also rely on specialized fabrication technology that requires dedicated and costly manufacturing processes. The drawbacks of CCD imaging technology are the following:

High-price due to specialized fabrication technology,
High-power consumption,
Random pixel access is not possible, i.e., pixels must be read out sequentially making it impossible for CCD imagers to easily access a subset of pixels within an image,
Low yields that are caused by a huge area (over 50%) of the imager being covered by a thin or inter-poly oxide that is prone to oxide punch-through
Data is transferred from the imager in the form of analog charge packets. Due to losses there is a maximum safe shifting distance limiting the practical size of the image sensor, and
Relatively slow frame rates.

Charge-coupled devices were the prevailing technology for image capture for 30 years; however, by the late 1990s, they began to be replaced in key applications by CMOS image sensors. CMOS technology has emerged as the dominant technology for digital circuit designs due to its favorable power-speed tradeoff and the high level of integration possible. As a result, CMOS has also attracted significant efforts toward implementation in a variety of mixed-signal designs. Thus, both analog preprocessing (filtering, amplification and A/D conversion) and digital processing have been combined in single-chip designs that may be fabricated with relatively inexpensive processes. CMOS technology also may be used to create inexpensive and effective imagers as well. Although the parameters such as sensitivity, dynamic range, and linearity of the CMOS imagers are inferior to CCD imagers, CMOS imagers have shown other advantages. For example, CMOS image sensors can be made at standard manufacturing facilities that produce almost 90% of all semiconductor chips, which significantly decreases their designing and manufacturing costs. Along with less expensive design and manufacturing, CMOS imagers have the following advantages:

Two orders of magnitude smaller power consumption compared to CCD imagers. This is a great advantage in battery-powered portable applications.
Available random access to pixel regions of interest within the imager. In CMOS imagers both the photodetector and the readout electronics are part of each pixel. This allows the charge from each photodetector to be converted into voltage/current values that can be randomly addressed and read out. Column and row addressability allows for window-of-interest readout (windowing). The windowing provides a greater flexibility in applications that need image processing (e.g. image compression, motion detection, or target tracking).
Intra-pixel amplification and analog-to-digital conversion accommodate faster frame rates. This advantage is particularly important in machine-vision and motion-analysis applications.
Transport of the pixel read out data in digital form rather than analog simplifies driving high-speed signals off-chip.
Output signals are less sensitive to crosstalk and pick-up.
CMOS technology allows most of the digital signal processing to be performed on-chip (e.g. image compression, color encoding, anti-jitter algorithms, multiresolution imaging, motion tracking, and control over wireless transmission links).

Small pixel area (high spatial resolution), high dynamic range (equally good response to both low and high light intensities), high linearity, and high frame rate are the most important features required of CMOS imager designs. Recently, along with the development of variety of the battery-powered devices, low power consumption has also emerged as an important requirement. Thus, the pixel readout circuits have emerged as critical design elements of CMOS imagers, and a variety of approaches have been used differing mostly by the number of pixels serviced by a single readout circuit. Designs range from readout circuits dedicated to each pixel up to circuits that are used to read out blocks of pixels, the various designs making different trade-offs in size, power, and performance.

The conventional CMOS image sensor architecture for today's consumer cameras and cell phones is the Active Pixel Sensor (APS). This was first developed in the 1980s and puts an amplifier at every pixel, but does the analog to digital conversion elsewhere on the chip. The more advanced chips are Digital pixel Sensors (DPS), which achieve lower noise by performing the analog to digital conversion at the pixel level. Pixim uses a conventional "Nyquist" ADC at each pixel. Pixim and SmaL use the Nyquist ADC at each pixel and increase the dynamic range by additional processing and storing multiple images.

The following four U.S. patents, naming William Mandl as inventor, are directed to image sensor architecture:

U.S. Pat. No. 5,248,971, "Method and apparatus for multiplexed over-sampled analog to digital modulation", Sep. 28, 1993.

U.S. Pat. No. 5,515,046, "Method and apparatus for multiplexed over-sampled analog to digital modulation", May 7, 1996.

U.S. Pat. No. 5,659,315, "Method and apparatus for multiplexed over-sampled analog to digital modulation", Aug. 19, 1997.

U.S. Pat. No. 6,597,371, "System for digitally driving addressable pixel matrix", Jul. 22, 2003.

However, in all Mandl's embodiments having external capacitance, the entire integrator structure is supplied for each pixel. As a consequence, the amount of circuitry associated with each pixel increases the minimum pixel size and decreases the fill factor. Also, in embodiments in which the photo-detecting elements are used as integrators of the $\Sigma\Delta$ modulator, the entire quantizer is multiplexed across an entire row (i.e., the input transistor of the comparator is not at the pixel site isolating the photo-detecting element); thus, crosstalk is a concern. Further, Mandl requires a non-standard CMOS process.

SUMMARY OF THE INVENTION

It is an objective of the invention to combine the small pixel size offered by performing analog-to-digital conversion away from the pixel level with the advantages in terms of high linearity, low power consumption and the like offered by performing analog-to-digital conversion at each pixel. It is another objective of the invention to allow the use of standard fabrication techniques.

To achieve the above and other ends, the present invention uses a multiplexed input-separated (MIS) $\Sigma\Delta$ ADC at each row rather than at each pixel. The $\Sigma\Delta$ ADC is separated such that only what is necessary is left at the pixel level, and everything else that is redundant at the pixel level is removed out of the pixel area and shared among the pixels of the row. In all embodiments of the present invention, the photo-detecting element is used as an integrator of the $\Sigma\Delta$ ADC structure. The quantizer unit of the MIS $\Sigma\Delta$ modulator structure is separated into an input transistor, which is placed at the pixel site, and the remainder of the quantizer body that is placed at the row level and multiplexed to the pixels of the row. At the same time, the digital-to-analog converter (DAC) used to provide a feedback of the MIS $\Sigma\Delta$ ADC structure is separated appropriately into the portion that is placed at the pixel level and the remainder that is multiplexed to the pixel of the row, or to the entire imager array. In order to allow multiplexing, an additional switch or switches are placed at the pixel site.

The present invention uses a multiplexed input-separated $\Sigma\Delta$ ADC, which provides a dynamic range much improved over the Nyquist ADC architecture. This image sensor with a pixel-level ADC embodies the advantages of both modem over-sampling sigma-delta ADC's and the design principles of low transistor count CMOS imager pixel readout circuits. Due to the over-sampling nature of the architecture, the transistors can be small to enable high pixel fill-factor. The design inherently has high linearity and low power consumption. The dynamic range of the design is intrinsically greater than 78 dB, or 13 bits, but could be greater by running at higher sampling frequency and higher power drain.

The present invention offers the following advantages over the technology proposed in the Mandl's patents. In all embodiments of the present invention the quantizer is separated into the input transistor that is supplied at the pixel level isolating the photodetector from readout lines, thus reducing crosstalk. The remainder of the quantizer body is placed outside the pixel area and multiplexed to the pixel through corresponding input transistors. The present invention proposes designs that are not supplied with a source-follower amplifier at the pixel, as opposed to Mandl's design. This reduces static current consumption at the pixel reducing overall power consumption. All embodiments can be implemented using standard technologies such as CMOS.

The following publication is hereby incorporated by reference in its entirety into the present disclosure: Z. Ignjatovic et al "A 0.88 nW/pixel, 99.6 dB Linear-Dynamic-Range Fully-Digital Image Sensor Employing a Pixel-Level Sigma-Delta ADC," IEEE VLSI Symposium, Jun. 14-15, 2006.

Modem oversampling ADC's are combined with the design principles of low transistor count CMOS imager pixel readout circuits. The disclosed embodiments require 3 transistors per pixel, and due to oversampling nature of the Sigma-delta architecture the transistors can be small. The expected dynamic range of the proposed Sigma-delta design is greater than 78 dB or 13 bits in terms of effective resolution and the expected power consumption is less than 1 nW per pixel.

BRIEF DESCRIPTION OF THE DRAWINGS

Preferred embodiments of the present invention will be set forth in detail with reference to the drawings, in which:

FIG. 3 is a schematic diagram showing the second preferred embodiment of the present invention, based on the separation of the design in FIG. 1;

FIG. 4 is a schematic diagram showing the third preferred embodiment of the present invention, based on the separation of the design in FIG. 1;

DETAILED DESCRIPTION OF THE PREFERRED EMBODIMENTS

Figure 1:
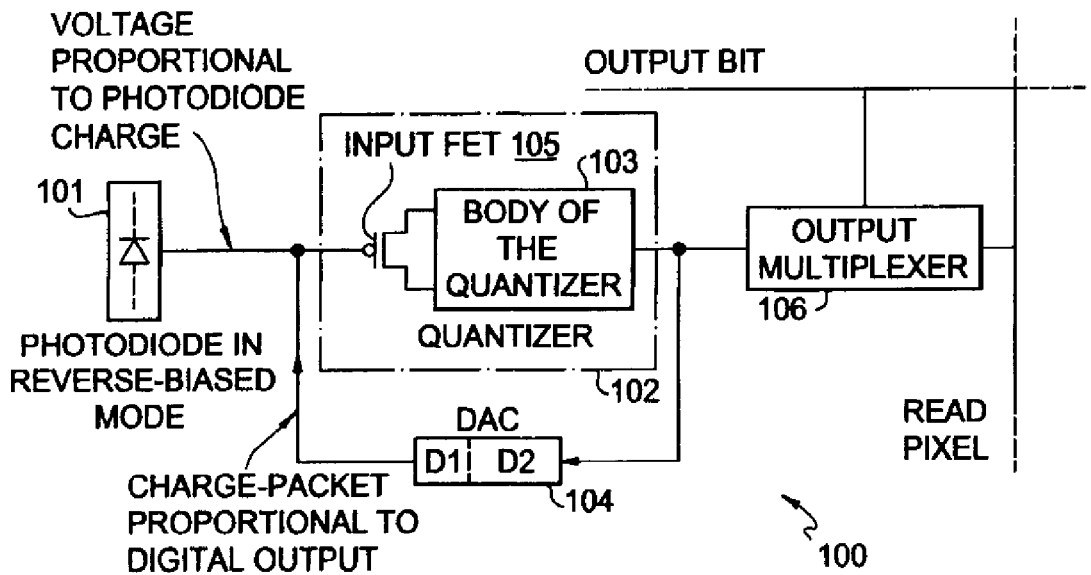
FIG. 1 is a schematic diagram showing a known fully-parallel $\Sigma\Delta$ ADC design for a single pixel using a photodiode as an integrator of the $\Sigma\ominus$ modulator.

Preferred embodiments of the invention will be set forth in detail below with reference to the drawings, in which like reference numerals refer to like elements throughout.

A block schematic of the known first-order pixel level $\Sigma\Delta$ ADC structure 100, where the integration effect of the photodiode in photo-voltaic mode is used, is shown in FIG. 1. The design shown in FIG. 1 is a fully-parallel design, meaning that each pixel is provided with separate ΣΔ ADC. The block 101 that represents the photosensitive elements contains the photodiode and possibly a biasing circuit to keep the photodiode in the photo-voltaic mode (e.g., a reset switch). While in the photovoltaic mode, the terminals of the photodiode are floating and the photo-generated charge that is built up inside the photo-diode is proportional to light intensity. The terminal voltage of the photodiode is proportional to the charge, and as such it is proportional to the light intensity. In conversion mode, when the ΣΔ ADC converts the input signal, the photodiode's terminal voltage is sensed by the quantizer 102 that produces the digital output and provides it to an output multiplexer 106. An input FET 105 of the quantizer 102 is drawn separately from the rest of the quantizer 102's body 103, because it may be separated in the proposed MIS ΣΔ ADC structure. A block that represents the digital-to-analog converter (DAC) 104 creates a feedback signal required for ΣΔ analog-to-digital converter. The DAC senses the digital output and accordingly creates a charge packet that is stored in or removed from the photodiode. The amount of the charge in the charge packet is fixed for the certain A/D conversion gain. A charge packet that contains more charge allows higher conversion gain and the ΣΔ ADC may respond to higher light intensities. The feedback DAC 104 is drawn as having two separate sub-circuits D1 and D2, because the D1 sub-circuit may be separated in the proposed MIS EA ADC structure. This design provides a dynamic range much improved over the Nyquist ADC architecture. However, this fully-parallel pixel-level ΣΔ ADC design suffers from low pixel fill-factor due to an increased number of transistors at the pixel site necessary for implementation.

Figure 2:
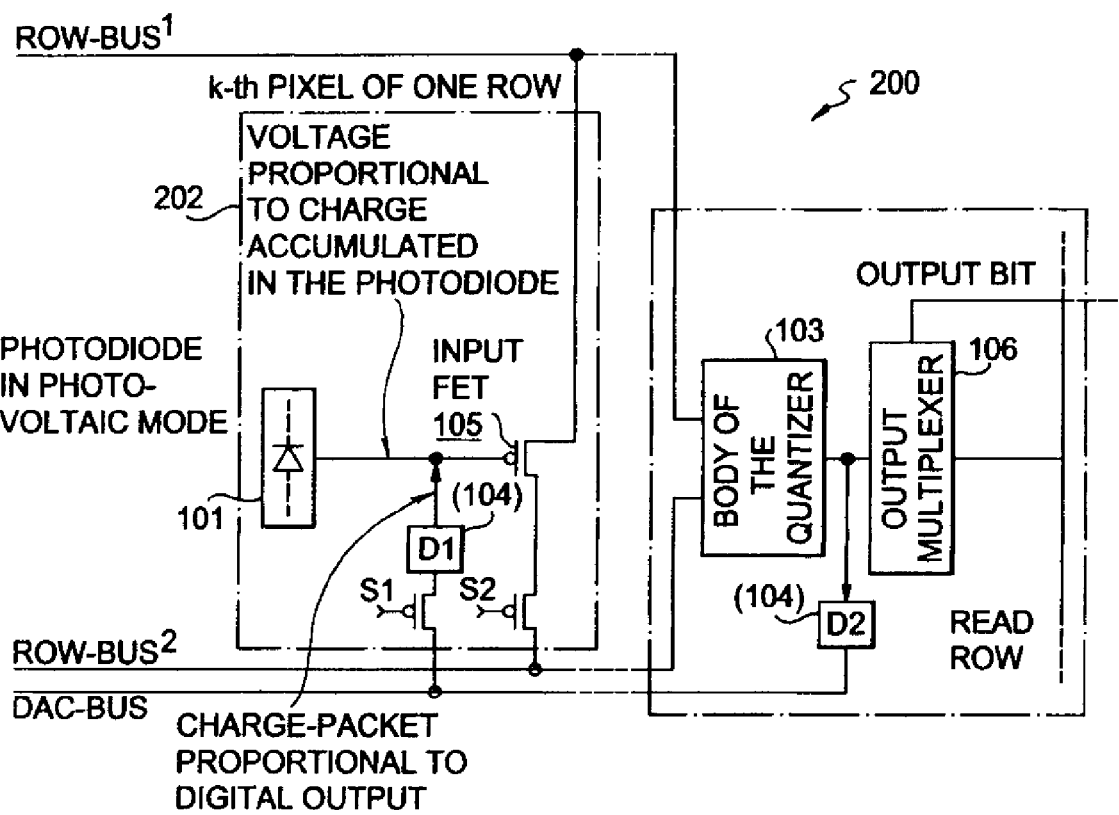
FIG. 2 is a schematic diagram showing the first preferred embodiment of the present invention, based on the separation of the design in FIG. 1.

The present invention offers a solution to the fill-factor problem related to the fully-parallel ΣΔ designs. As shown in FIG. 2, in the structure 200, the fully-parallel ΣΔ ADC is separated such that only what is necessary is left at the pixel level 202, and everything else is removed from the pixel area and shared among the pixels of the row. In all embodiments of the present invention, the photodetecting element is used as an integrator of the MIS ΣΔ ADC structure. The quantizer unit of the MIS ΣΘ modulator structure is separated into an input transistor 105, which is placed at the pixel site, and the remainder of the quantizer body 103 that is placed at the row level and multiplexed to the pixels of the row. At the same time, the DAC 104 used to create a feedback signal of the MIS ΣΔ ADC is separated appropriately into the portion that is placed at the pixel site (D1) and the remainder (D2) that is multiplexed to the pixels of the row. In order to allow multiplexing, additional MOSFET switches S1 and S2 are placed at the pixel site. The switches are driven with appropriate timing circuitry to allow multiplexing operation. The operation of the first embodiment of the MIS ΣΔ ADC shown in FIG. 2 is described below.

When the $k^{th}$ pixel of the row is idle meaning that the MIS EA ADC is reading some other pixel of the row, the input MOSFET 105 is disconnected from the bus lines (ROW_BUS1 and ROW_BUS2) and the DAC's sub-circuit D1 is disconnected from the DAC_BUS line. During this idle state, the photodiode is in a photo-voltaic mode integrating photo-generated charge. When the MIS EA ADC is due to read the $k^{th}$ pixel, the switch S2 is asserted connecting the input MOSFET to the bus line ROW_BUS2. As a result, the input MOSFET forms a quantizer unit with the remainder of the quantizer body 103. Also, the DAC's sub-circuit D1 is connected to the DAC_BUS line thought the switch S1 and together with sub-circuit D2 that is outside the pixel area at the row level forms the DAC unit. The quantizer unit then compares the photodiode's terminal voltage to appropriate threshold voltage value. If the photodiode's voltage is higher than the threshold value, the quantizer outputs bit 0 and the DAC unit stay inactive (i.e., does not perform a feedback operation). The $k^{th}$ pixel is then disconnected from the bus lines and the MIS ΣΔ ADC continues to the next pixel of the row ($(k+1)^{th}$ pixel). Otherwise, if the photodiode's voltage is lower than the threshold value, the quantizer outputs bit 1 and the DAC unit performs a feedback operation according to the ΣΔ ADC operating principle. The DAC unit injects the fixed amount of charge, which increases the photodiode's voltage above the threshold value. The DAC unit may operate as a constant current source that provides fixed amount of charge if deployed within certain time interval; or it may operate similarly to charge-coupled-devices transferring fixed charge from capacitive elements. The k-th pixel is then disconnected from the bus lines and the MIS ΣΔ ADC continues to the next pixel ($(k+1)^{th}$ pixel) of the row. A negative logic is also possible, where the quantizer unit outputs bits that are complementary to above mentioned values. The output bits from each pixel are stored either in a raw data format or in decimated format (i.e., following the decimation procedure that reduces the data rate to the Nyquist rate). In this embodiment, each pixel row is provided with its quantizer body, such that all pixels of $k^{th}$ column are processed in parallel. Also, each row is provided with a separate DAC's sub-circuit D2 that is shared among the pixels of that row. The pixel columns are read in a sequential order.

FIG. 3 shows a second embodiment 300 of the present invention. The quantizer unit of the MIS ΣΔ modulator structure is separated into an input MOSFET transistor 105, which is placed at the pixel site 202, and the remainder of the quantizer body 103 that is placed at the row level and multiplexed to the pixels of the row. At the same time, the DAC 104 used to create a feedback signal of the MIS ΣΔ ADC is separated appropriately into the sub-circuit that is placed at the pixel site (D1) and the remainder (D2) placed outside the pixel area. As opposed to the first embodiment shown in FIG. 2 where sub-circuit D2 is placed at the row level, in the second embodiment a sub-circuit D2 is used for an entire imager (i.e., it is shared among all rows). In order to allow multiplexing, additional MOSFET switches S1 and S2 are placed at the pixel site. The switches are driven with appropriate timing circuitry to allow multiplexing operation. The operation of the second embodiment of the MIS ΣΔ ADC shown in FIG. 3 is described below.

When the $k^{th}$ pixel of the row is idle meaning that the MIS ΣΔ ADC is reading some other pixel of the row, the input MOSFET is disconnected from the bus lines (ROW_BUS1 and ROW_BUS2) and the DAC's sub-circuit D1 is disconnected from the DAC_BUS line. During this idle state, the photodiode is in a photo-voltaic mode integrating photo-generated charge. When the MIS ΣΔ ADC is due to read $k^{th}$ pixel, the switch S2 is asserted connecting the input MOSFET to the bus line ROW_BUS2. As a result, the input MOSFET forms a quantizer unit with the remainder of the quantizer body 103. Also, the DAC's sub-circuit D1 is connected to the DAC_BUS line thought the switch S1 and together with sub-circuit D2 that is unique for entire imager forms a DAC unit. The quantizer unit then compares the photodiode's terminal voltage to appropriate threshold voltage value. If the photodiode's voltage is higher than the threshold value, the quantizer outputs bit 0, which is applied to a switch 302, and the DAC unit stays inactive (i.e., does not perform a feedback operation). The $k^{th}$ pixel is then disconnected from the bus lines, and the MIS ΣΔ ADC continues to the next pixel of the row ((k+1)$^{th}$ pixel). Otherwise, if the photodiode's voltage is lower than the threshold value, the quantizer outputs bit 1 and the DAC unit performs a feedback operation according to ΣΔ ADC operating principle. The DAC unit injects the fixed amount of charge, which increases the photodiode's voltage above the threshold value. The DAC unit may operate as a constant current source that provides fixed amount of charge if deployed within certain time interval; or it may operate similarly to charge-coupled-devices transferring fixed charge from capacitive elements. The k-th pixel is then disconnected from the bus lines and the MIS EA ADC continues to the next pixel ((k+1)$^{th}$ pixel) of the row. A negative logic is also possible, where the quantizer unit outputs bits that are complementary to above mentioned values. The output bits from each pixel are stored either in a raw data format or in decimated format (i.e., following the decimation procedure that reduces the data rate to the Nyquist rate). In this embodiment, each pixel row is provided with its quantizer body, such that all pixels of k$^{th}$ column are processed in parallel. The entire imager is provided with single DAC's sub-circuit D2 that is shared among all pixels of the imager. The pixel columns are read in a sequential order.

FIG. 4 shows third embodiment 400 of the present invention. The quantizer unit of the MIS ΣΘ modulator structure is separated into an input MOSFET transistor 105, which is placed at the pixel site 402, and the remainder of the quantizer body 103 that is placed at the row level and multiplexed to the pixels of the row. At the same time, the DAC 104 used to create a feedback signal of the MIS EA ADC is separated appropriately into the portion that is placed at the pixel site (D1) and the remainder (D2) that is placed at the row level and multiplexed to the pixels of the row. In order to allow multiplexing, additional MOSFET switch S2 is placed at the pixel site. The switch S2 is driven with appropriate timing circuitry to allow multiplexing operation. As opposed to the first and second embodiment, the ROW_BUS2 line serves a dual purpose to provide a multiplexing switch 404 for the quantizer and a multiplexing switch 406 for the feedback DAC. Thus, both quantizer unit and feedback DAC unit share the same bus line ROW_BUS2. The operation of the third embodiment of the MIS ΣΔ ADC shown in FIG. 4 is described below.

When the k$^{th}$ pixel of the row is idle meaning that the MIS ΣΔ ADC is reading some other pixel of the row, the input MOSFET and the sub-circuit D1 are disconnected from the bus line ROW_BUS2. During this idle state, the photodiode is in a photo-voltaic mode integrating photo-generated charge. When the MIS ΣΔ ADC is due to read the k$^{th}$ pixel, the switch S2 is asserted connecting the input MOSFET to the bus line ROW_BUS2. Simultaneously, the READ switch 404 in the row level structure is asserted. As a result, the input MOSFET forms a quantizer unit with the remainder of the quantizer body 103. The quantizer unit then compares the photodiode's terminal voltage to appropriate threshold voltage value. If the photodiode's voltage is higher than the threshold value, the quantizer unit outputs bit 0 and the DAC unit remains inactive (i.e., does not perform a feedback operation). The k$^{th}$ pixel is then disconnected from the bus line ROW_BUS2 and the MIS ΣΔ ADC continues to the next pixel of the row ((k+1)$^{th}$ pixel). Otherwise, if the photodiode's voltage is lower than the threshold value, the quantizer unit outputs bit 1. Then, the READ switch 404 is disconnected and the FEEDBACK switch 406, which is also at the row level, is asserted. As a result, the DAC's sub-circuit D1 of the k$^{th}$ pixel is connected to the sub-circuit D2 that is placed at the row level forming the DAC unit. The DAC unit then injects the fixed amount of charge, which increases the photodiode's voltage above the threshold value. The DAC unit may operate as a constant current source that provides fixed amount of charge if deployed within certain time interval; or it may operate similarly to charge-coupled-devices transferring fixed amount of charge from capacitive elements. The k-th pixel is then disconnected from the bus line ROW_BUS2 and the MIS ΣΔ ADC continues to the next pixel ((k+1)$^{th}$ pixel) of the row. A negative logic is also possible, where the quantizer unit outputs bits that are complementary to above mentioned values. The output bits from each pixel are stored either in a raw data format or in decimated format (i.e., following the decimation procedure that reduces the data rate to the Nyquist rate). In this embodiment, each pixel row is provided with its quantizer body, such that all pixels of k$^{th}$ column are processed in parallel. Also, each row is provided with a separate DAC's sub-circuit D2 that is shared among the pixels of that row. The pixel columns are read in a sequential order.

Figure 5:
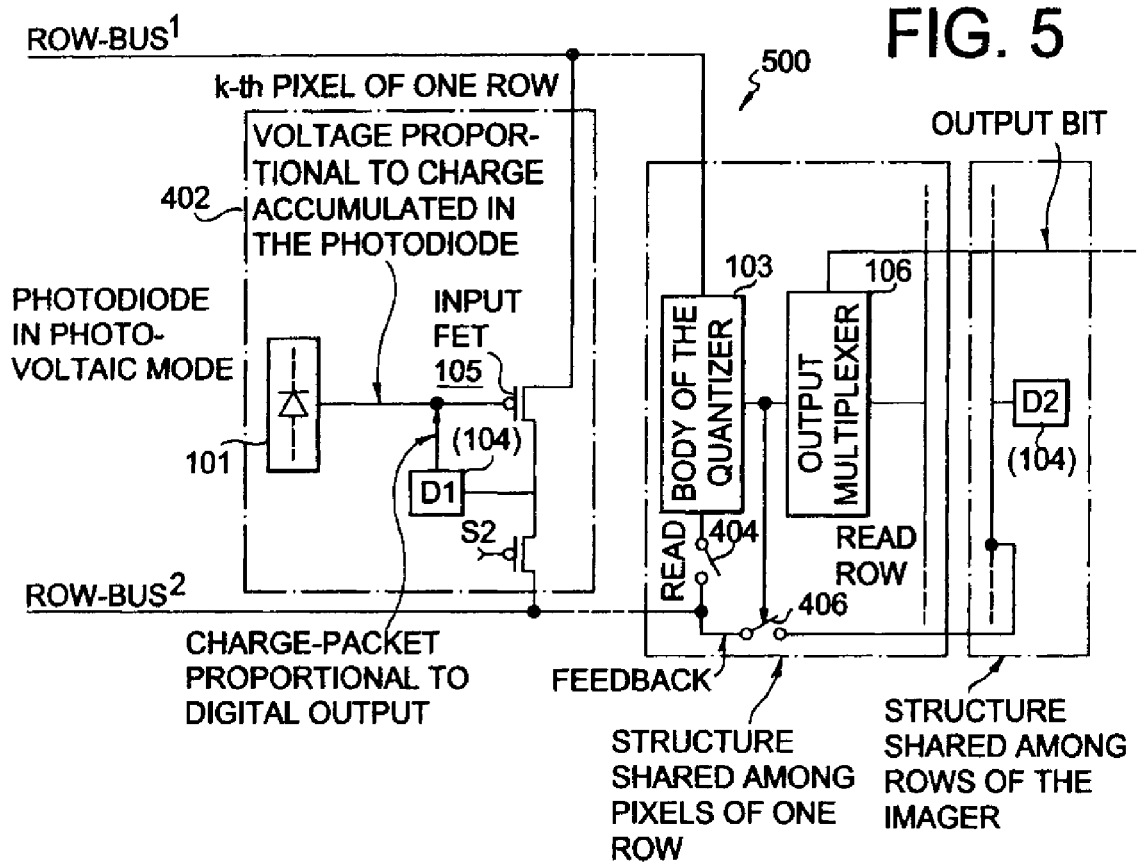
FIG. 5 is a schematic diagram showing the fourth preferred embodiment of the present invention, based on the separation of the design in FIG. 1.

FIG. 5 shows fourth embodiment 500 of the present invention. The quantizer unit of the MIS ΣΘ modulator structure is separated into an input MOSFET transistor, which is placed at the pixel site, and the remainder of the quantizer body 103 that is placed at the row level and multiplexed to the pixels of the row. At the same time, the DAC 104 used to create a feedback signal of the MIS ΣΔ ADC is separated appropriately into the sub-circuit that is placed at the pixel site (D1) and the remainder (D2) placed outside the pixel area. As opposed to the first and third embodiment shown in FIGS. 2 and 4, where sub-circuit D2 is placed at the row level, in the fourth embodiment a sub-circuit D2 is used for an entire imager (i.e., it is shared among all rows), similarly to the second embodiment. In order to allow multiplexing, additional MOSFET switch S2 is placed at the pixel site. The switch S2 is driven with appropriate timing circuitry to allow multiplexing operation. Similarly to the third embodiment, the ROW_BUS2 line serves a dual purpose to provide multiplexing means for the quantizer and multiplexing means for the feedback DAC. Thus, both quantizer unit and feedback DAC unit share the same bus line ROW_BUS2. The operation of the third embodiment of the MIS ΣΔ ADC shown in FIG. 5 is described below.

Figure 6:
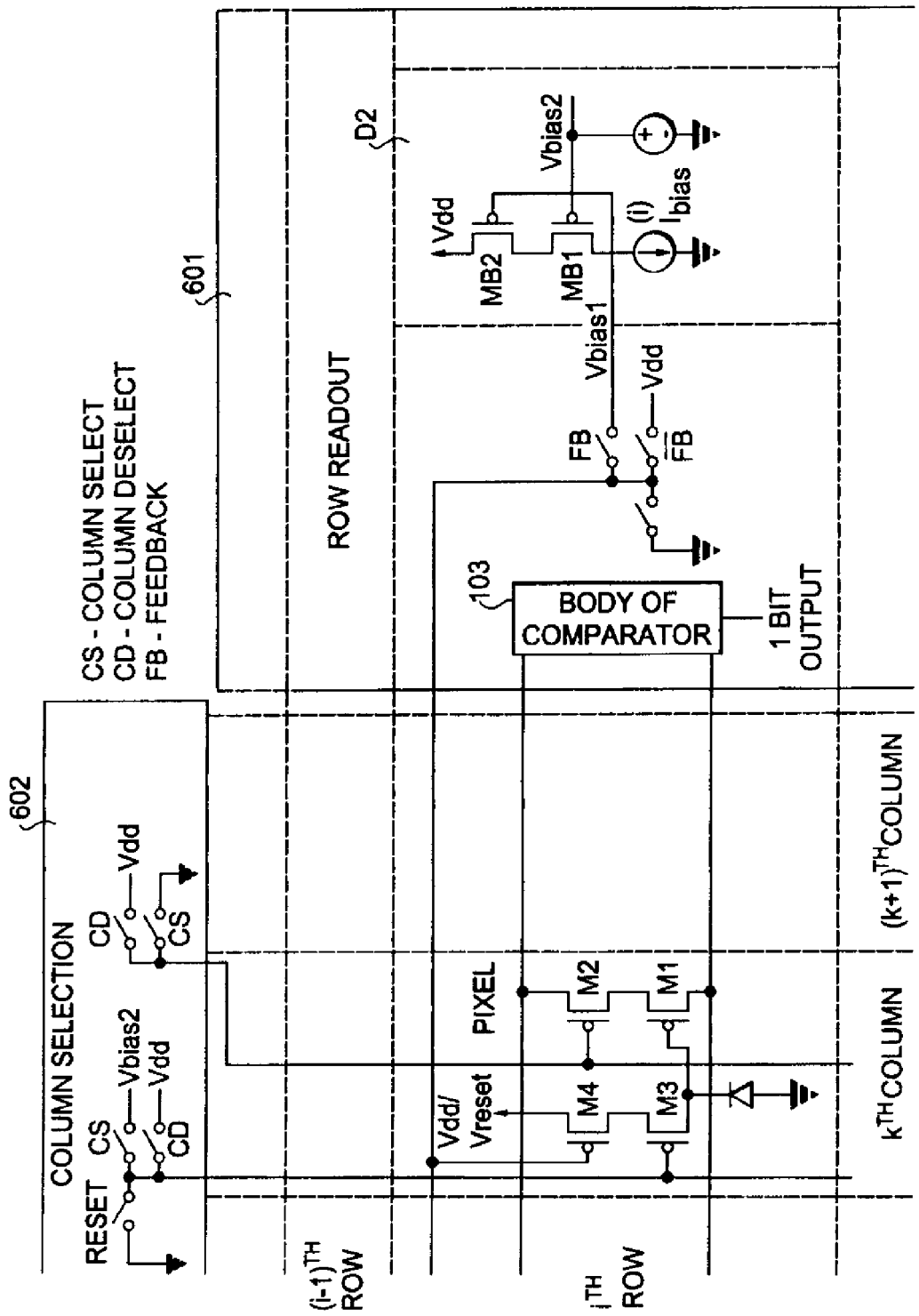
FIG. 6 is a schematic diagram showing a variation of the first preferred embodiment of the present invention, based on the design in FIG. 2.

When the k$^{th}$ pixel of the row is idle meaning that the MIS ΣΔ ADC is reading some other pixel of the row, the input MOSFET and the sub-circuit D1 are disconnected from the bus line ROW_BUS2. During this idle state, the photodiode is in a photo-voltaic mode integrating photo-generated charge. When the MIS ΣΔ ADC is due to read k$^{th}$ pixel, the switch S2 is asserted connecting the input MOSFET to the bus line ROW_BUS2. Simultaneously, the READ switch 404 in the row level structure is asserted. As a result, the input MOSFET forms a quantizer unit with the remainder of the quantizer body 103. The quantizer unit then compares the photodiode's terminal voltage to appropriate threshold voltage value. If the photodiode's voltage is higher than the threshold value, the quantizer unit outputs bit 0 and the DAC unit remains inactive (i.e., does not perform a feedback operation). The k$^{th}$ pixel is then disconnected from the bus line ROW_BUS2 and the MIS ΣΔ ADC continues to the next pixel of the row ((k+1)$^{th}$ pixel). Otherwise, if the photodiode's voltage is lower than the threshold value, the quantizer unit outputs bit 1 and connects associated row to the external sub-circuit D2. Then, the READ switch 404 is disconnected and the FEEDBACK switch 406, which is also at the row level, is asserted. As a result, the DAC's sub-circuit D1 of the k$^{th}$ pixel is connected to the sub-circuit D2 that is placed at the imager level forming the DAC unit. The DAC unit then injects the fixed amount of charge, which increases the photodiode's voltage above the threshold value. The DAC unit may operate as a constant current source that provides fixed amount of charge if deployed within certain time interval; or it may operate similarly to charge-coupled-devices transferring fixed amount of charge from capacitive elements. The k-th pixel is then disconnected from the bus line ROW_BUS2 and the MIS ΣΔ ADC continues to the next pixel ((k+1)$^{th}$ pixel) of the row. A negative logic is also possible, where the quantizer unit outputs bits that are complementary to above mentioned values. The output bits from each pixel are stored either in a raw data format or in decimated format (i.e., following the decimation procedure that reduces the data rate to the Nyquist rate). In this embodiment, each pixel row is provided with its quantizer body, such that all pixels of k$^{th}$ column are processed in parallel. Also, a unique DAC's sub-circuit D2 is placed at the imager level and it is shared among the rows of the imager. The pixel columns are read in a sequential order A variation of the first embodiment is shown in FIG. 6. The quantizer is separated into the input transistor M1 that is placed at the pixel site and the remainder of the quantizer body 103 placed at the row level 601. An additional MOSFET switch M2 is used to multiplex the transistor M1 to the buslines. Both transistors M1 and M2 could independently be either p-type or n-type MOS transistors. The feedback DAC of the MIS ΣΔ ADC is formed such to operate as a wide-swing high-output-impedance current mirror. The sub-circuit D1 at each pixel is implemented with two transistors M3 and M4. The remainder of the DAC (sub-circuit D2) placed at the row level 601 serves as a biasing network for the wide-swing high-output-impedance current mirror. Each pixel row is supplied with a separate sub-circuit D2. Assuming that the photodiode is implemented either as an nwell/psub or n+/psub diode in an n-well process, the transistors M3 and M4 are both p-type MOS transistors. Otherwise, assuming that the photodiode is either a pwell/nsub or p+/nsub diode in a p-well process, the transistors M3 and M4 are both n-type MOS transistors. The type of the MOS transistors in sub-circuit D2 is the same as in sub-circuit D1. The operation of the first variation of the first preferred embodiment is described below assuming that the nwell/psub or n+/psub photodiode in an n-well process is used.

The pixel reset operation, where the photodiode's voltage is set to appropriate initial state, is performed by turning on both M3 and M4 transistors. In this mode, these transistors act both as switches connecting the photodiode to the reset voltage value V$_{reset}$. The transistors M3 and M4 are turned on by asserting switch RESET at the column level 602 and switch RESET at the row level 601, respectively. During the reset operation, the transistor M2 is in cut-off by asserting the switch CD at the column level 602, which guaranties that transistor M1 is disconnected from the bus lines. The reset operation could be performed locally by asserting transistors M3 and M4 of a particular pixel or pixel group. Also, it could be performed globally as a global reset, where the transistors M3 and M4 of all pixels of the imager are asserted connecting all photodiodes simultaneously to the reset voltage When the k$^{th}$ pixel column is idle meaning that the MIS ΣΔ ADC is reading other pixel column, the pixels of the k$^{th}$ column are disconnected from the bus lines. This is achieved by biasing the gates of the transistors M2 and M3 of the k$^{th}$ column to the most positive potential (switches CD and CD1 at the column level 602 are turned on). The photodiodes of the k$^{th}$ column pixels are collecting photo-generated charge and performing integration operation. When the k$^{th}$ pixel column is due to be read, the transistors M2 of all pixels of the k$^{th}$ column are asserted (CS switch at the column level is turned on) connecting input transistors M1 through bus lines to the corresponding quantizer bodies 103 at the end of the rows forming quantizer units. The quantizer units then compare the photodiodes' voltages to a threshold value and output digital bits accordingly. It is assumed that if the photodiode's voltage falls below the threshold value the row structure outputs bit 1. However, a negative logic implementation is also possible. Following the comparison operation all transistors M3 of the k$^{th}$ pixel column are connected to the biasing node V$_{bias2}$ though the switch CS1 that is at the column level 602. Depending on output bit from the particular rows, only the transistors M4 of the rows that output digital bit 1 are connected to V$_{bias1}$ through the switch FB that is at the row level 601. As a result, the transistors M3 and M4 of the pixels that belong to the k$^{th}$ column and rows that output bit 1 form current mirrors with sub-circuit D2, which provides feedback signal to corresponding pixels. The transistors M3 and M4 of the i$^{th}$ row and k$^{th}$ column pixel mirror the reference current I$^{bias(i)}$ into the photodiode during certain time interval providing a fixed amount of charge. The mirrored current value is proportional to the aspect ratio of the transistors M3 and M4 with respect to the aspect ratio of the transistors in sub-circuit D2. The amount of positive charge that is fed back to the photodiode is determined by the mirrored current amplitude and time duration during which the feedback signal is applied. When the row shared structures are finished reading the pixels of the k$^{th}$ column and the feedback signal is provided to appropriate pixels of the k$^{th}$ column, the imager control disconnects the k$^{th}$ column by turning off transistors M3 and M2. Imager control then continues to the (k+1)$^{th}$ column. The output bits from each pixel are stored in the memory in either raw data format or in the form following a decimation procedure.

Figure 7:
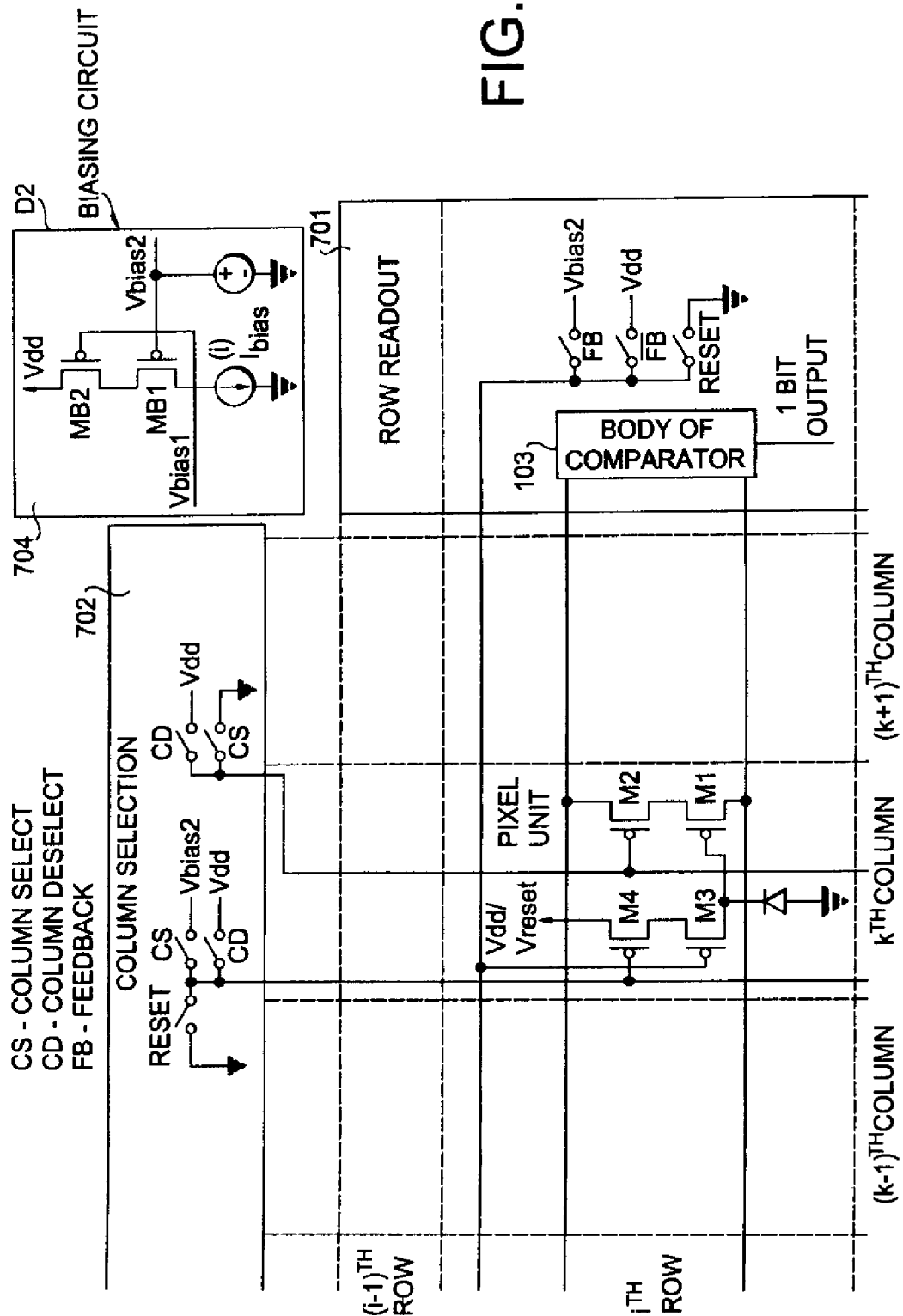
FIG. 7 is a schematic diagram showing a variation of the second preferred embodiment of the present invention, based on the design in FIG. 3.

A variation of the second embodiment is shown in FIG. 7. The operating principle of this variation is the same as in the first variation of the first embodiment (FIG. 6). The difference between two is that a unique DAC's sub-circuit D2 (704) is supplied for entire imager array and multiplexed to the imager rows instead of each pixel row having separate sub-circuit D2.

Figure 8:
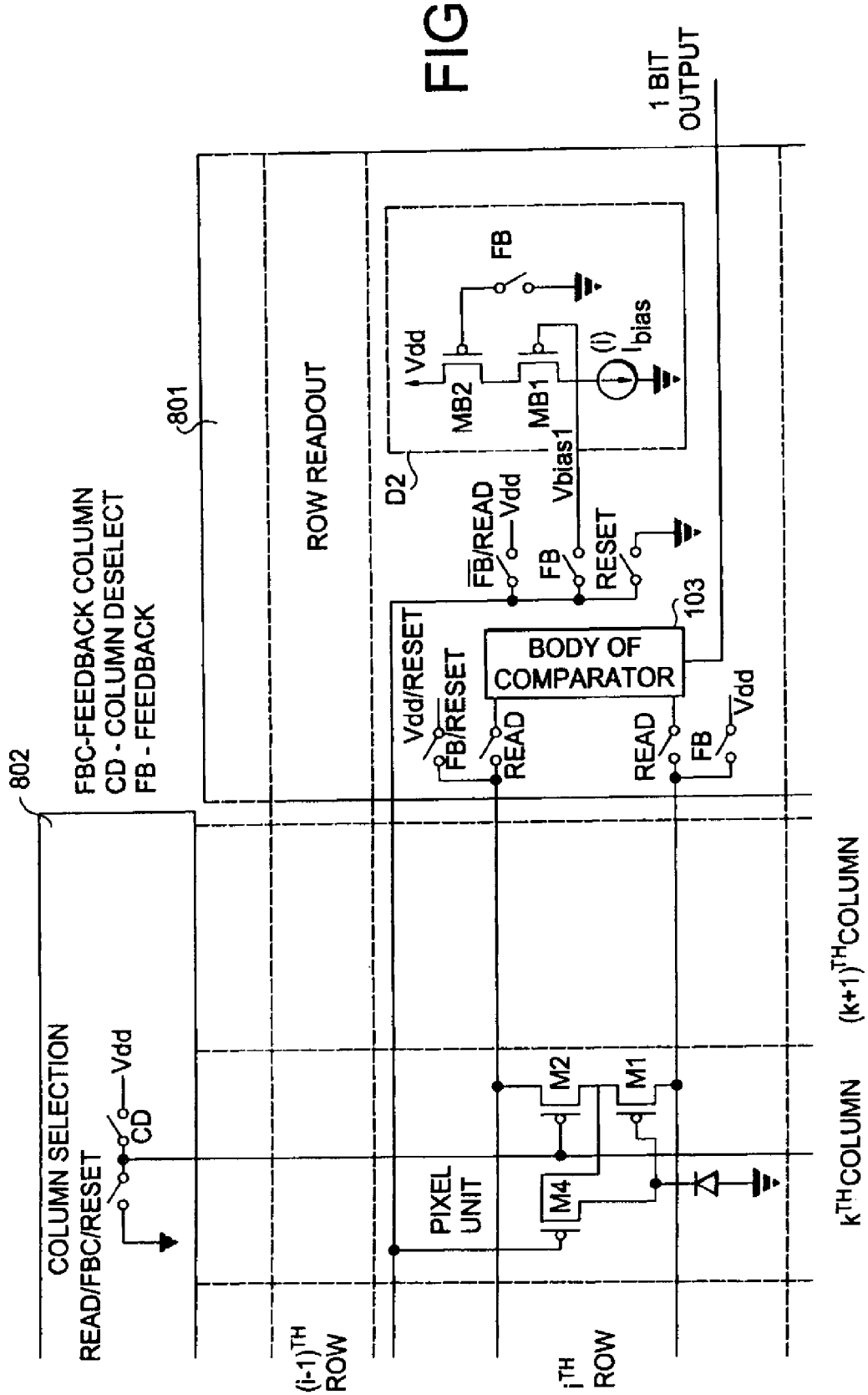
FIG. 8 is a schematic diagram showing a variation of the third preferred embodiment of the present invention, based on the design in FIG. 4.

A variation of the third embodiment is shown in FIG. 8. The quantizer is separated into the input transistor M1 that is placed at the pixel site and the remainder of the quantizer's body 103 placed at the end of the row. An additional MOSFET switch M2 is used to multiplex the transistor M1 and the sub-circuit D1 to the bus-lines. Therefore, both quantizer unit and DAC unit share the same bus line. The feedback DAC of the MIS ΣΔ ADC is formed such to operate as a current mirror. The sub-circuit D1 at each pixel is implemented, with transistor M3 and it is multiplexed to the bus-line through the transistor M2. The remainder of the DAC (sub-circuit D2) is a biasing network of the current mirror. Each pixel row is supplied with a separate sub-circuit D2. Assuming that the photodiode is implemented either as an nwell/psub or n+/psub diode in an n-well process, the transistors M2 and M3 are both p-type MOS transistors. In this case, the transistor M1 is required to be an n-type MOS transistor. Otherwise, assuming that the photodiode is either a pwell/nsub or p+/nsub diode in a p-well process, the transistors M2 and M3 are both n-type and the transistor M1 is p-type MOS transistor. The type of the MOS transistors in sub-circuit D2 is the same as in sub-circuit D1. This design variation of the preferred embodiment achieves lower transistor count than the previous variations. This is achieved by sharing the transistor M2 between the sub-circuit D1 and quantizer multiplexing network. The operation of the first variation of the third embodiment is described below assuming that an nwell/psub or n+/psub photodiode in an n-well process is used.

The pixel reset operation, where the photodiode's voltage is set to appropriate initial state, is performed by turning on both M2 and M3 transistors. The transistors M2 and M3 are turned on by asserting switch RESET at the column level 802 and switches RESET at the row level 801, respectively. In this mode, the transistors M2 and M3 act both as switches connecting the photodiode to the reset voltage value $V_{reset}$. The reset operation could be performed locally by asserting transistors M2 and M3 of a particular pixel or pixel group. Also, it could be performed globally as a global reset, where the transistors M2 and M3 of all pixels of the imager are asserted connecting all photodiodes simultaneously to the reset voltage $V_{reset}$.

When the $k^{th}$ pixel column is idle meaning that the MIS ΣΔ ADC is reading other pixel column, the pixels of the $k^{th}$ column are disconnected from the bus lines. This is achieved by biasing the gates of the transistors M2 of the $k^{th}$ column to the most positive potential (switch CD at the column level 802 is turned on). The photodiodes of the $k^{th}$ column pixels are collecting photo-generated charge and performing integration operation. When the $k^{th}$ pixel column is due to be read, the transistors M2 of all pixels of the $k^{th}$ column are asserted (READ switch at the column level 802 is turned on) and READ switches at the row level 801 are turned on connecting input transistors M1 through bus lines to the corresponding quantizer bodies 103 at the end of the rows forming quantizer units. At the same time the transistors M3 of the $k^{th}$ column are held in cut-off. The quantizer units then compare the photodiodes' voltages to a threshold value and output digital bits accordingly. It is assumed that if the photodiode's voltage falls below the threshold value the row structure outputs bit 1. However, a negative logic implementation is also possible. Following the comparison operation all READ switches are turned off and the transistors M2 of the $k^{th}$ column are connected to the most negative potential through the switch FBC at the column level 802. Depending on output bit from the particular rows, only the transistors M3 of the rows that output digital bit 1 are connected to $V_{bias1}$ through the switch FB that is at the row level 801. As a result, only the transistors M3 of the pixels that belong to the $k^{th}$ column and rows that output bit 1 form current mirrors with sub-circuits D2, which provides feedback signal to corresponding pixels. The transistor M3 that forms the DAC unit with sub-circuit D2 mirrors the reference current $I_{bias}^{(i)}$ into the corresponding photodiode during certain time interval providing a fixed amount of charge. The mirrored current value is proportional to the aspect ratio of the transistor M3 with respect to the aspect ratio of the transistor MB1 in sub-circuit D2. The amount of positive charge that is fed back to the photodiode is determined by the mirrored current amplitude and time duration during which the feedback signal is applied. The transistor MB2 of the sub-circuit D2 is provided to balance the load of the transistor M2 such that both transistors M3 and MB1 see that same load on their source terminals. The transistor MB2 could be turned on all the time or it could be controlled by FB signal such that it is conducting only during feedback operation. The later approach reduces static current consumption by disconnecting the flow of the $I_{bias}^{(i)}$ through the transistors MB1 and MB2, when the feedback operation is not necessary. During the feedback operation, the source of the transistor M1 is held to most positive potential to guarantee that M1 transistors are in cut-off. When the row shared structures are finished reading the pixels of the $k^{th}$ column and the feedback signal is provided to appropriate pixels of the $k^{th}$ column, the imager control disconnects the $k^{th}$ column by turning off transistor M2. Imager control then continues to the $(k+1)^{th}$ column. The output bits from each pixel are stored in the memory in either raw data format or in the form following a decimation procedure.

Figure 9:
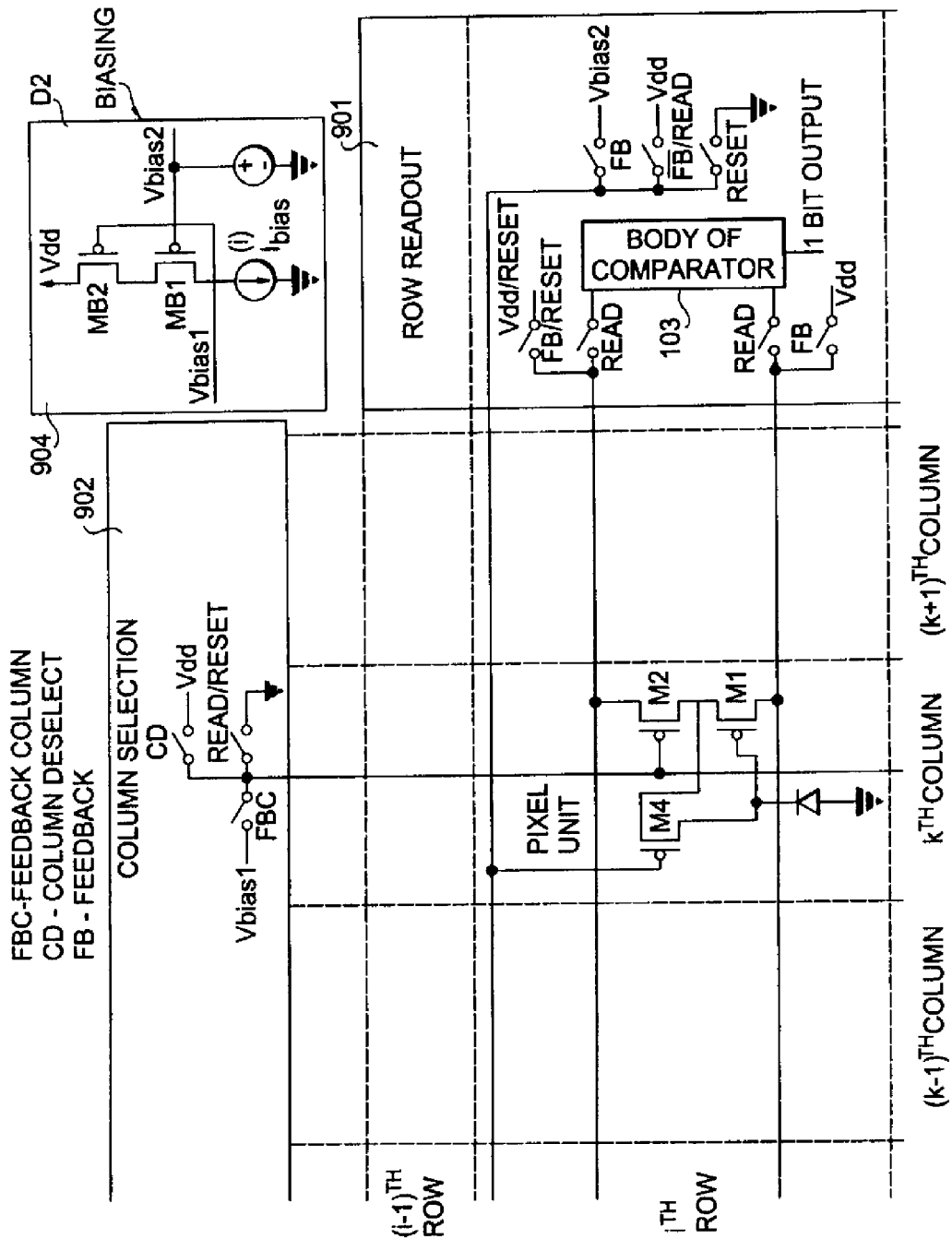
FIG. 9 is a schematic diagram showing a variation of the fourth preferred embodiment of the present invention, based on the design in FIG. 5.

A variation of the fourth embodiment is shown in FIG. 9. The quantizer is separated into the input transistor M1 that is placed at the pixel site and the remainder of the quantizer's body 103 placed at the end of the row. An additional MOSFET switch M2 is used to multiplex the transistor M1 and the sub-circuit D1 to the bus-lines. Therefore, both quantizer unit and DAC unit share the same bus line. The feedback DAC of the MIS ΣΔ ADC is formed such to operate as a wide-swing high-output-impedance current mirror. The sub-circuit D1 at each pixel is implemented with the transistor M3 and it is multiplexed to the bus-line through the transistor M2. The remainder of the DAC (sub-circuit D2) is a biasing network of the current mirror. A unique DAC's sub-circuit D2 (904) is supplied for an entire imager array and it is multiplexed to the imager rows as opposed to the first variation of the third embodiment where each row is provided with separate sub-circuit D2. Assuming that the photodiode is implemented either as an nwell/psub or n+/psub diode in an n-well process, the transistors M2 and M3 are both p-type MOS transistors. In this case, the transistor M1 is required to be an n-type MOS transistor. Otherwise, assuming that the photodiode is either a pwell/nsub or p+/nsub diode in a p-well process, the transistors M2 and M3 are both n-type and the transistor M1 is p-type MOS transistor. The type of the MOS transistors in sub-circuit D2 is the same as in sub-circuit D1. This design variation of the preferred embodiment achieves lower transistor count than the variations of the first and second embodiment. Similarly to the variation of the third embodiment, this transistor count saving is achieved by sharing the transistor M2 between the sub-circuit D1 and quantizer multiplexing network. The operation of the first variation of the fourth embodiment is described below assuming that an nwell/psub or n+/psub photodiode in an n-well process is used.

The pixel reset operation, where the photodiode's voltage is set to appropriate initial state, is performed by turning on both M2 and M3 transistors. The transistors M2 and M3 are turned on by asserting RESET switches at both column level structure 902 and row level 901. In this mode, the transistors M2 and M3 act both as switches connecting the photodiode to the reset voltage value $V_{reset}$. The reset operation could be performed locally by asserting transistors M2 and M3 of a particular pixel or pixel group. Also, it could be performed globally as a global reset, where the transistors M2 and M3 of all pixels of the imager are asserted connecting all photodiodes simultaneously to the reset voltage $V_{reset}$.

When the $k^{th}$ pixel column is idle meaning that the MIS EA ADC is reading other pixel column, the pixels of the $k^{th}$ column are disconnected from the bus lines. This is achieved by biasing the gates of the transistors M2 of the $k^{th}$ column to the most positive potential (switch CD at the column level 902 is turned on). The photodiodes of the $k^{th}$ column pixels are collecting photo-generated charge and performing integration operation. When the $k^{th}$ pixel column is due to be read, the transistors M2 of all pixels of the $k^{th}$ column are asserted (READ switch at the column level 902 is turned on) and READ switches at the row level 901 are turned on connecting input transistors M1 through bus lines to the corresponding quantizer bodies 103 at the end of the rows forming quantizer units. At the same time the transistors M3 of the $k^{th}$ column are held in cut-off. The quantizer units then compare the photodiodes' voltages to a threshold value and output digital bits accordingly. It is assumed that if the photodiode's voltage falls below the threshold value the row structure outputs bit 1. However, a negative logic implementation is also possible. Following the comparison operation all READ switches are turned off and the gates of the transistors M2 of the $k^{th}$ column are connected to the $V_{bias1}$ through the switch FBC at the column level 902. Depending on the output bit from the particular rows, only the transistors M3 of the rows that output digital bit 1 are connected to $V_{bias2}$ through the switch FB that is placed at the row level 901. The voltage values $V_{bias1}$ and $V_{bias2}$ are defined by the sub-circuit D2 that is provided at the imager level. As a result, only the transistors M3 of the pixels that belong to the $k^{th}$ column and rows that output bit 1 form current mirrors with sub-circuits D2, which provides feedback signal to corresponding pixels. The transistor M3 that forms the feedback DAC unit with sub-circuit D2 mirrors the reference current $I_{bias}$ into the corresponding photodiode during certain time interval providing a fixed amount of charge. The mirrored current value is proportional to the aspect ratios of the transistors M2 and M3 with respect to the aspect ratio of the transistors MB2 and MB1 in sub-circuit D2. The amount of positive charge that is fed back to the photodiode is determined by the mirrored current amplitude and time duration during which the feedback signal is applied. During the feedback operation, the source of the transistor M1 is held to the most positive potential to guarantee that M1 transistors are in cut-off. When the row shared structures are finished reading the pixels of the $k^{th}$ column and the feedback signals are provided to appropriate pixels of the $k^{th}$ column, the imager control disconnects the $k^{th}$ column by turning off transistor M2 (CD switch at the column level 902 is asserted). Imager control then continues to the $(k+1)^{th}$ column. The output bits from each pixel are stored in the memory in either raw data format or in the form following a decimation procedure.

Figure 10:
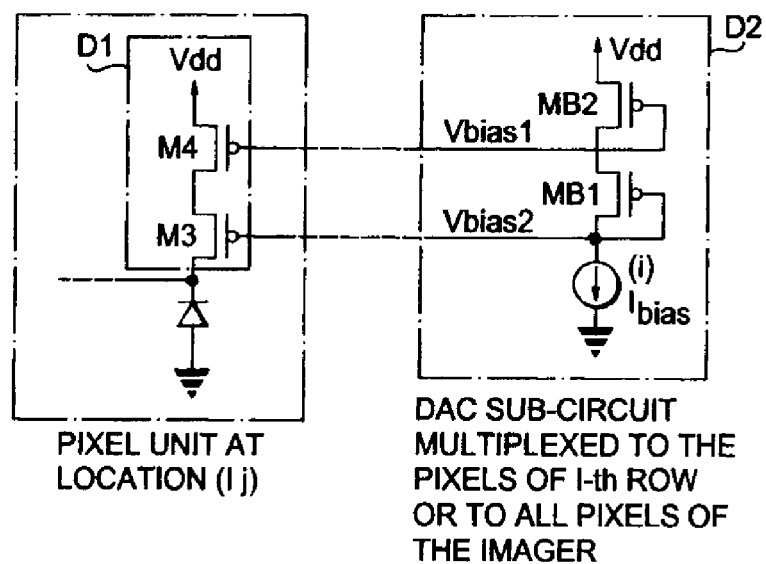
FIG. 10 is a schematic diagram showing a cascode current mirror variation of the feedback DAC unit.

In variations of all the preferred embodiments (FIGS. 6, 7, 8, and 9) it was assumed that the feedback DAC is implemented as a current mirror that mirrors a reference current $I_{bias}$ to the photodiodes providing a feedback signal. In the variations of the first, second, and fourth embodiments (FIGS. 6, 7, and 9), the feedback DAC is implemented as a wide-swing cascode current mirror. Such a current mirror is characterized with an enhanced output-impedance and high-voltage swing at its output node. However, other implementations are possible such as cascode current mirror, as shown in FIG. 10. The sub-circuit D2 of the cascode current mirror contains two diode-connected transistors MB1 and MB2 and it does not require a voltage source to provide $V_{bias2}$ voltage, as opposed to the wide-swing cascode current mirror. This current mirror is also characterized with enhanced output-impedance; however, it suffers from lowered voltage swing at the output node, which is the drain terminal of the transistor M3. This effectively decreases the voltage swing at the photodiode, which lowers overall dynamic range.

In all aforementioned variations of the preferred embodiments, the applied threshold voltage values of the rows have a unique value for the entire imager array. However, in other variations of this present invention the different threshold voltage values may be applied to different pixel rows. Also, the threshold voltage values may be dithered with a random (or pseudo-random) sequence in order to reduce limit cycles often associated with the first-order ΣΔ ADC structures. The dithering procedure of the threshold voltage values associated with different pixel rows may be applied in both temporal and spatial (row basis) domain or separately. Still other variations can be realized within the scope of the invention. For example, numerical values are illustrative rather than limiting, as are fabrication techniques. Therefore, the present invention should be construed as limited only by the appended claims.

We claim:

1. A multiplexed input-separated ΣΔ analog-to-digital converter for an array of photodetectors, each of the photodetectors in the array functioning as an integrator, the converter comprising a quantizer, the quantizer being separated into:
    an input transistor at a pixel defined by each of the photodetectors; and
    a quantizer body for each row of the pixels, the quantizer body connected to the input transistors in the row.

2. The converter of claim 1, further comprising a feedback loop between the quantizer body and each of the pixels in the row.

3. The converter of claim 2, wherein the feedback loop comprises a digital-to-analog converter.

4. The converter of claim 3, wherein the digital-to-analog converter comprises a first component and a second component, and wherein the first component is provided for each of the photodetectors at a corresponding one of the pixels.

5. The converter of claim 4, wherein the second component is provided for each of the rows.

6. The converter of claim 5, wherein a connection from the input transistor to the quantizer body is on a separate bus from the feedback loop.

7. The converter of claim 6, wherein the feedback loop comprises a switch.

8. The converter of claim 7, wherein the switch operates under control of an output of the quantizer body.

9. The converter of claim 4, wherein a single second component is provided for an entirety of the array.

10. The converter of claim 9, wherein a connection from the input transistor to the quantizer body is on a separate bus from the feedback loop.

11. The converter of claim 10, wherein the feedback loop comprises a switch.

12. The converter of claim 11, wherein the switch operates under control of an output of the quantizer body.

13. A multiplexed input-separated ΣΔ analog-to-digital converter for an array of photodetectors, each of the photodetectors in the array functioning as an integrator, the converter comprising:
    an input transistor at a pixel defined by each of the photodetectors;
    a quantizer body for each row of the pixels, the quantizer body connected to the input transistors in the row; and
    a feedback loop between the quantizer body and each of the pixels in the row;
    wherein the feedback loop comprises a digital-to-analog converter;
    wherein the digital-to-analog converter comprises a first component and a second component, and wherein the first component is provided for each of the photodetectors at a corresponding one of the pixels;
    wherein the second component is provided for each of the rows; and
    wherein a connection from the input transistor to the quantizer body is on a common bus with the feedback loop.

14. The converter of claim 13, wherein the common bus comprises a switch for connecting the common bus in alternation with the quantizer body and the feedback loop.

15. A multiplexed input-separated ΣΔ analog-to-digital converter for an array of photodetectors, each of the photodetectors in the array functioning as an integrator, the converter comprising:
    an input transistor at a pixel defined by each of the photodetectors;
    a quantizer body for each row of the pixels, the quantizer body connected to the input transistors in the row; and
    a feedback loop between the quantizer body and each of the pixels in the row;

wherein the feedback loop comprises a digital-to-analog converter;

wherein the digital-to-analog converter comprises a first component and a second component, and wherein the first component is provided for each of the photodetectors at a corresponding one of the pixels;

wherein a single second component is provided for an entirety of the array; and wherein a connection from the input transistor to the quantizer body is on a common bus with the feedback loop.

16. The converter of claim 15, wherein the common bus comprises a switch for connecting the common bus in alternation with the quantizer body and the feedback loop.

17. The converter of claim 16, wherein the feedback loop comprises a switch.

18. The converter of claim 17, wherein the switch in the feedback loop operates under control of an output of the quantizer body.

19. A multiplexed input-separated $\Sigma\Delta$ analog-to-digital converter for an array of photodetectors, each of the photodetectors in the array functioning as an integrator, the converter comprising:

an input transistor at a pixel defined by each of the photodetectors;

a quantizer body for each row of the pixels, the quantizer body connected to the input transistors in the row; and a feedback loop between the quantizer body and each of the pixels in the row;

wherein a connection from the input transistor to the quantizer body is on a common bus with the feedback loop.

* * * * *